(12) United States Patent
Leobandung et al.

(10) Patent No.: US 9,059,043 B1
(45) Date of Patent: Jun. 16, 2015

(54) FIN FIELD EFFECT TRANSISTOR WITH SELF-ALIGNED SOURCE/DRAIN REGIONS

(71) Applicant: International Business Machines Corporation, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/177,319

(22) Filed: Feb. 11, 2014

(51) Int. Cl.
| | | |
|---|---|---|
| H01L 29/78 | (2006.01) | |
| H01L 27/12 | (2006.01) | |
| H01L 21/84 | (2006.01) | |
| H01L 21/225 | (2006.01) | |
| H01L 21/311 | (2006.01) | |
| H01L 21/02 | (2006.01) | |
| H01L 29/66 | (2006.01) | |

(52) U.S. Cl.
CPC .......... *H01L 27/1211* (2013.01); *H01L 21/845* (2013.01); *H01L 21/2256* (2013.01); *H01L 21/31111* (2013.01); *H01L 21/02164* (2013.01); *H01L 29/785* (2013.01); *H01L 29/66795* (2013.01)

(58) Field of Classification Search
CPC ............ H01L 29/785; H01L 29/66795; H01L 21/845; H01L 27/1211; H01L 21/823431; H01L 21/823821; H01L 27/10826; H01L 27/10879
USPC ....................................................... 438/268
See application file for complete search history.

(56) References Cited

U.S. PATENT DOCUMENTS

| | | | |
|---|---|---|---|
| 6,642,090 B1 * | 11/2003 | Fried et al. ..................... 438/164 |
| 7,009,250 B1 * | 3/2006 | Mouli ............................ 257/347 |
| 7,235,436 B1 * | 6/2007 | Lin et al. ....................... 438/154 |
| 7,544,556 B1 | 6/2009 | Mui et al. |
| 7,749,847 B2 | 7/2010 | Cabral, Jr. et al. |
| 7,955,928 B2 | 6/2011 | Chan et al. |
| 8,440,552 B1 | 5/2013 | Chen et al. |
| 8,445,974 B2 | 5/2013 | Chidambarrao et al. |
| 8,618,636 B1 * | 12/2013 | Chang et al. .................. 257/565 |
| 2003/0057486 A1 * | 3/2003 | Gambino et al. ............. 257/347 |
| 2004/0048424 A1 * | 3/2004 | Wu et al. ....................... 438/154 |
| 2004/0217433 A1 * | 11/2004 | Yeo et al. ...................... 257/412 |
| 2005/0124099 A1 * | 6/2005 | Beintner et al. .............. 438/164 |
| 2007/0045748 A1 * | 3/2007 | Booth et al. .................. 257/369 |
| 2007/0057325 A1 * | 3/2007 | Hsu et al. ...................... 257/347 |
| 2008/0237719 A1 | 10/2008 | Doyle et al. |

(Continued)

*Primary Examiner* — Steven J Fulk
(74) *Attorney, Agent, or Firm* — Scully, Scott, Murphy & Presser, P.C.; Louis J. Percello

(57) ABSTRACT

A gate cavity is formed over a semiconductor fin by forming a disposable gate structure and a planarization dielectric layer over the semiconductor fin, and by removing the disposable gate structure. A doped silicate glass spacer including an electrical dopant is formed on sidewalls of the gate cavity by deposition and an anisotropic etch of a conformal doped silicate glass layer. A gate spacer including a diffusion barrier material is formed on inner sidewalls of the doped silicate glass spacer. A replacement gate structure is formed within the gate cavity, and source/drain regions are formed in portions of the semiconductor fin by outdiffusion of the electrical dopant during an anneal. The source/drain regions are formed within the semiconductor fin, and are self-aligned to the replacement gate electrode.

18 Claims, 18 Drawing Sheets

(56) References Cited

U.S. PATENT DOCUMENTS

| | | | |
|---|---|---|---|
| 2009/0035909 A1* | 2/2009 | Chang et al. | 438/276 |
| 2011/0129990 A1* | 6/2011 | Mandrekar et al. | 438/558 |
| 2011/0147842 A1* | 6/2011 | Cappellani et al. | 257/365 |
| 2011/0309333 A1* | 12/2011 | Cheng et al. | 257/24 |
| 2012/0091528 A1* | 4/2012 | Chang et al. | 257/347 |
| 2013/0102137 A1* | 4/2013 | Jeng | 438/548 |
| 2013/0115763 A1* | 5/2013 | Takamure et al. | 438/513 |
| 2013/0122676 A1* | 5/2013 | Jeng | 438/306 |

\* cited by examiner

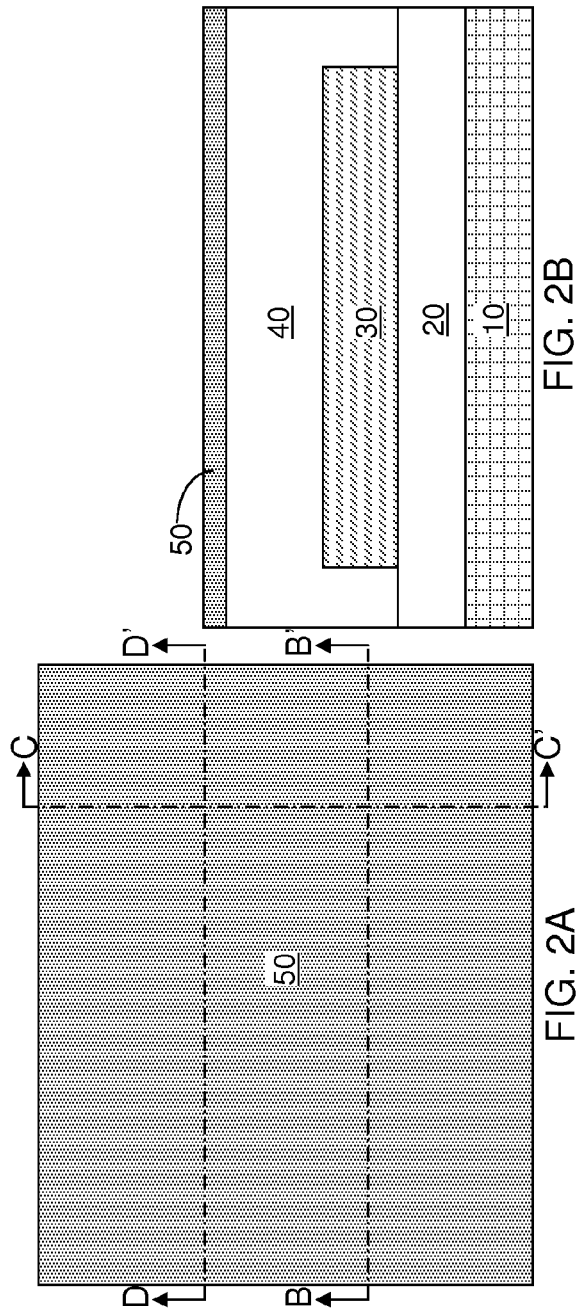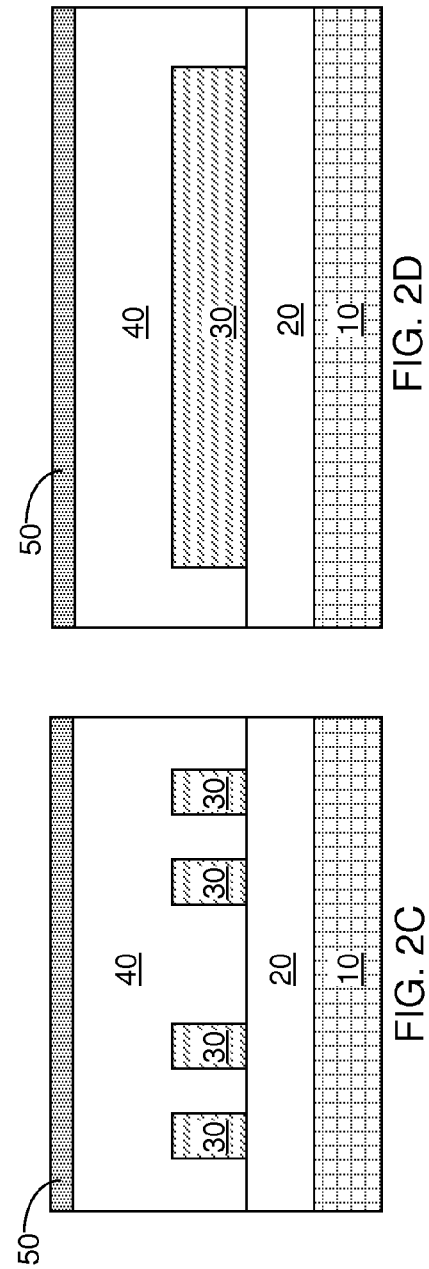

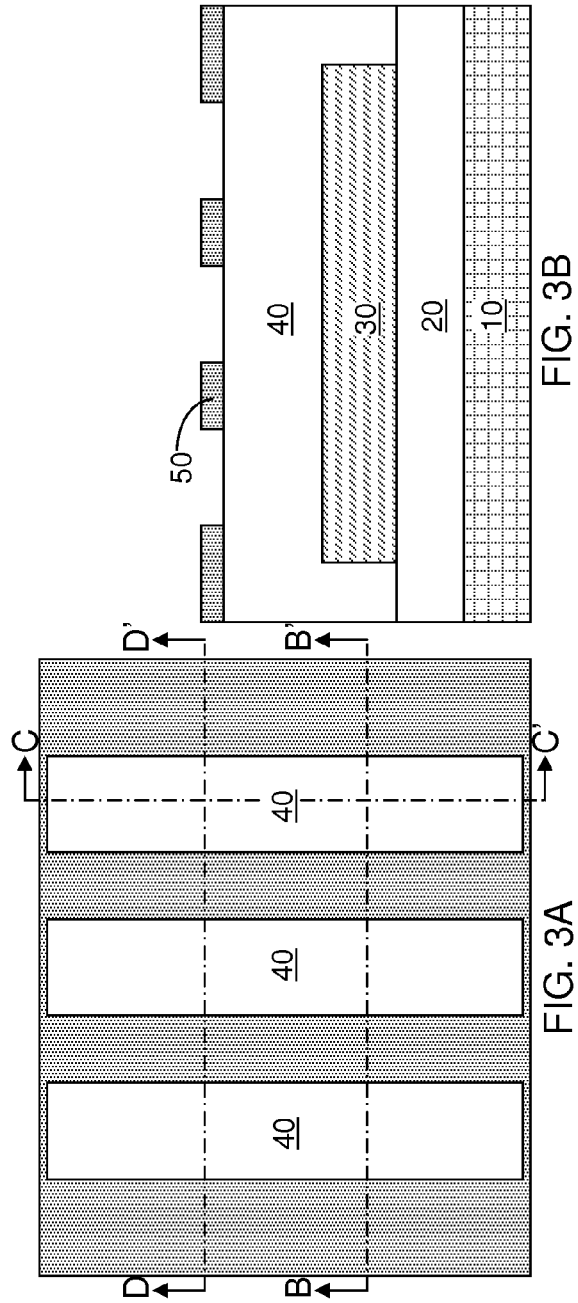
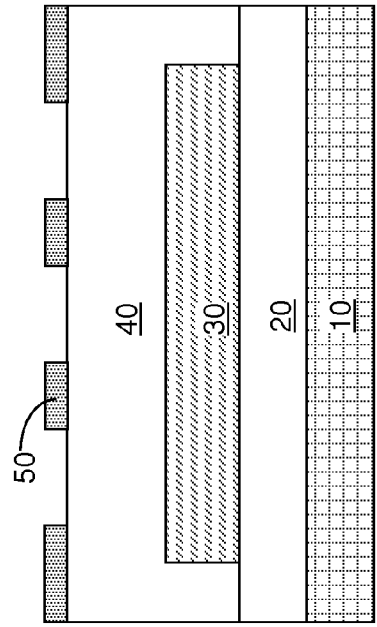
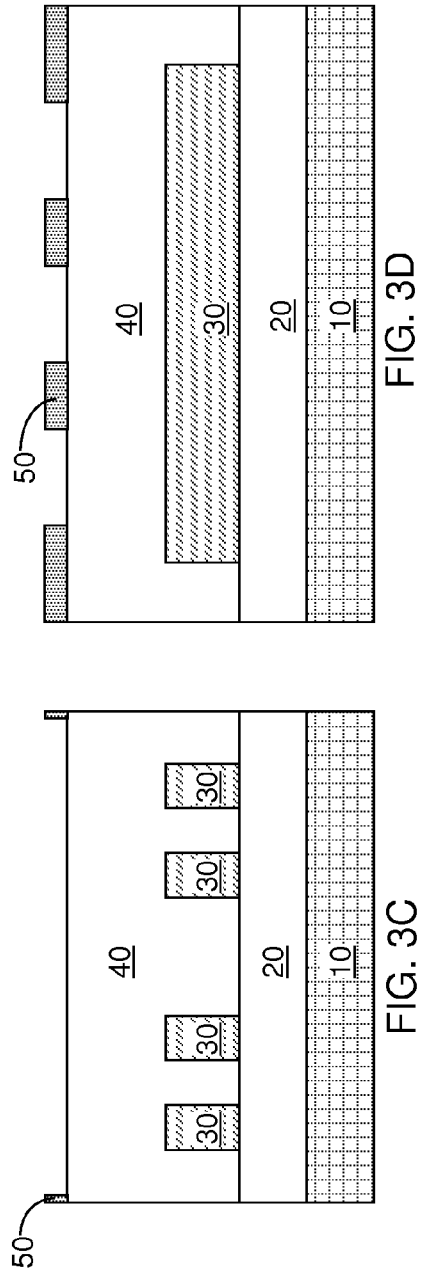

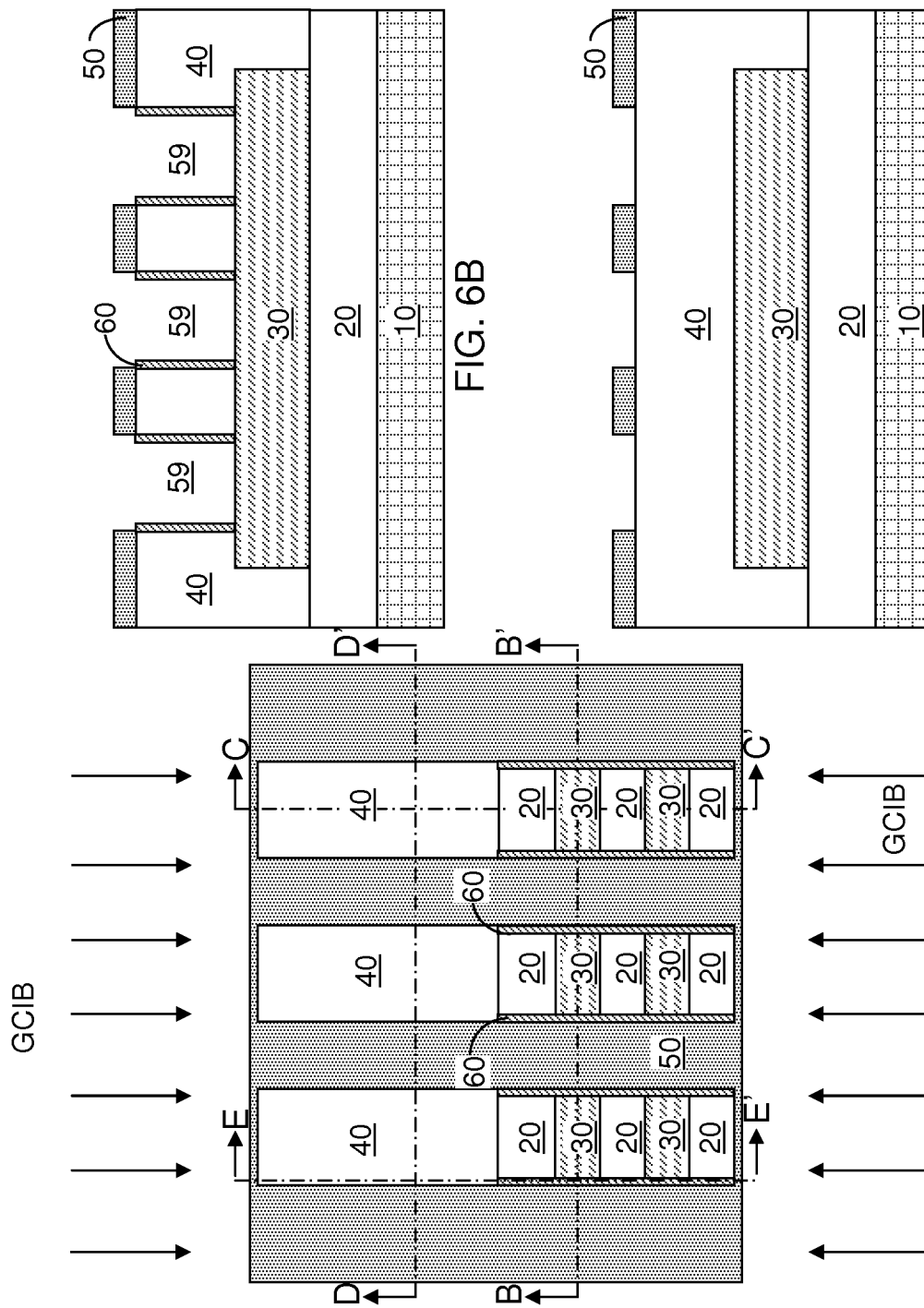

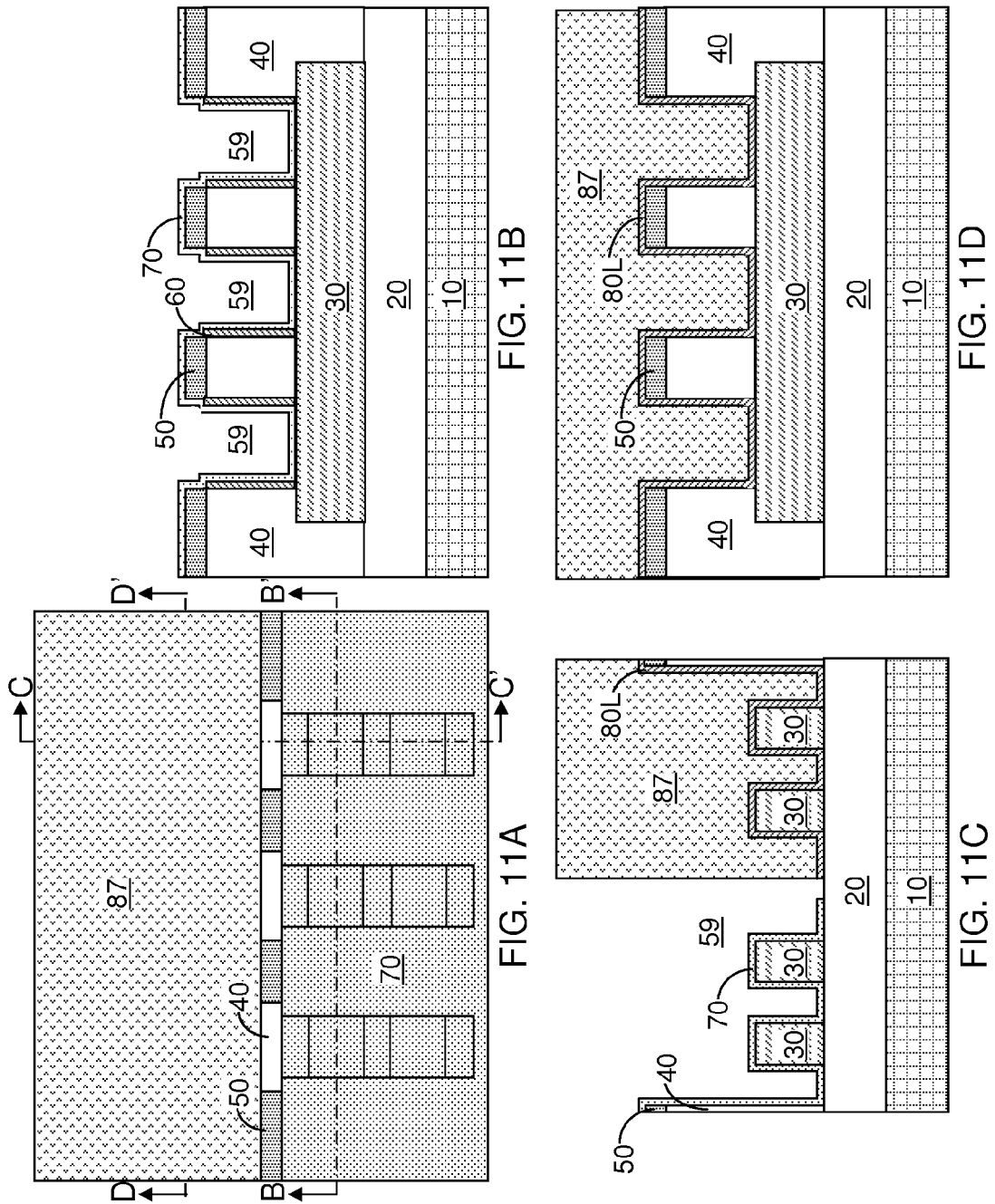

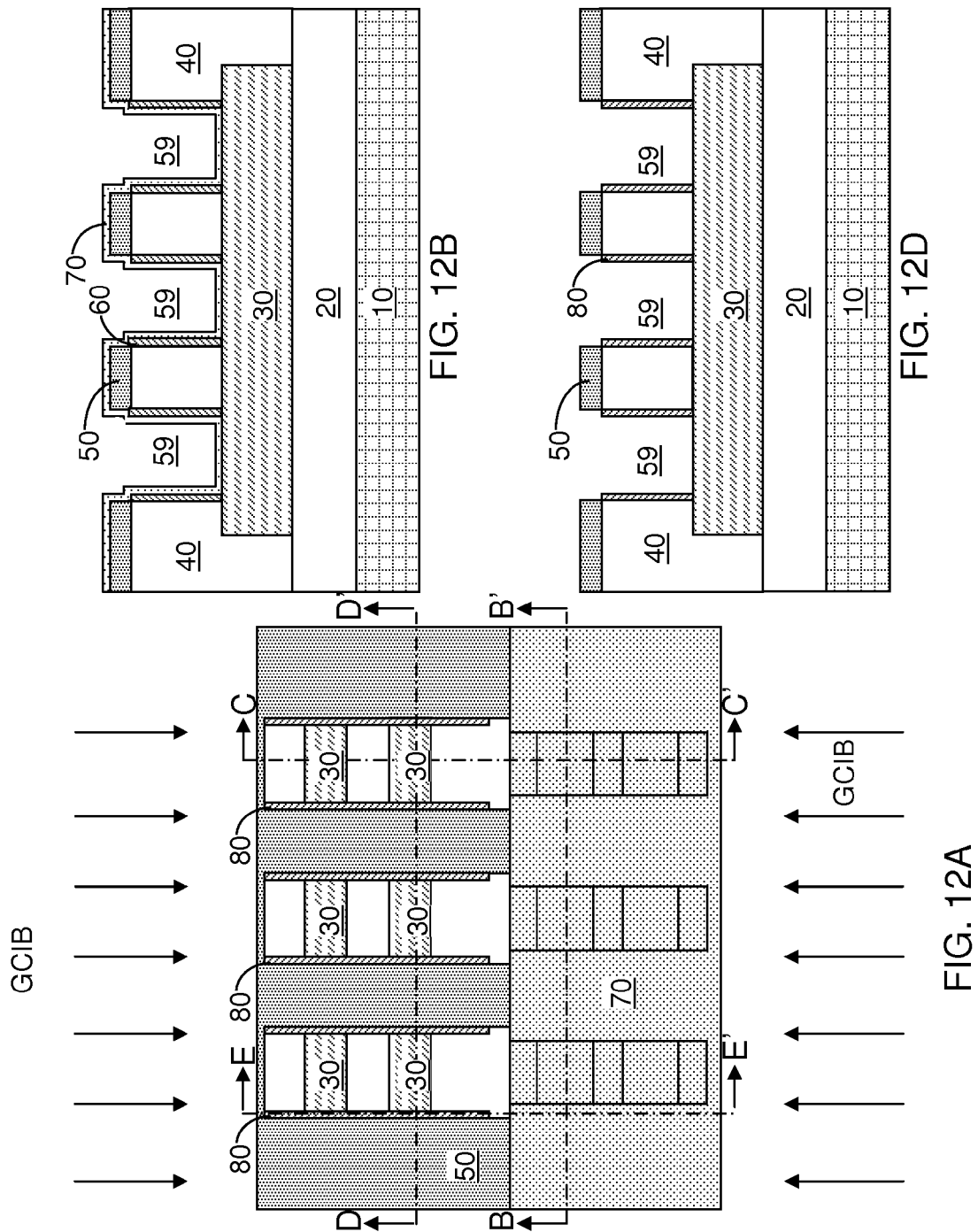

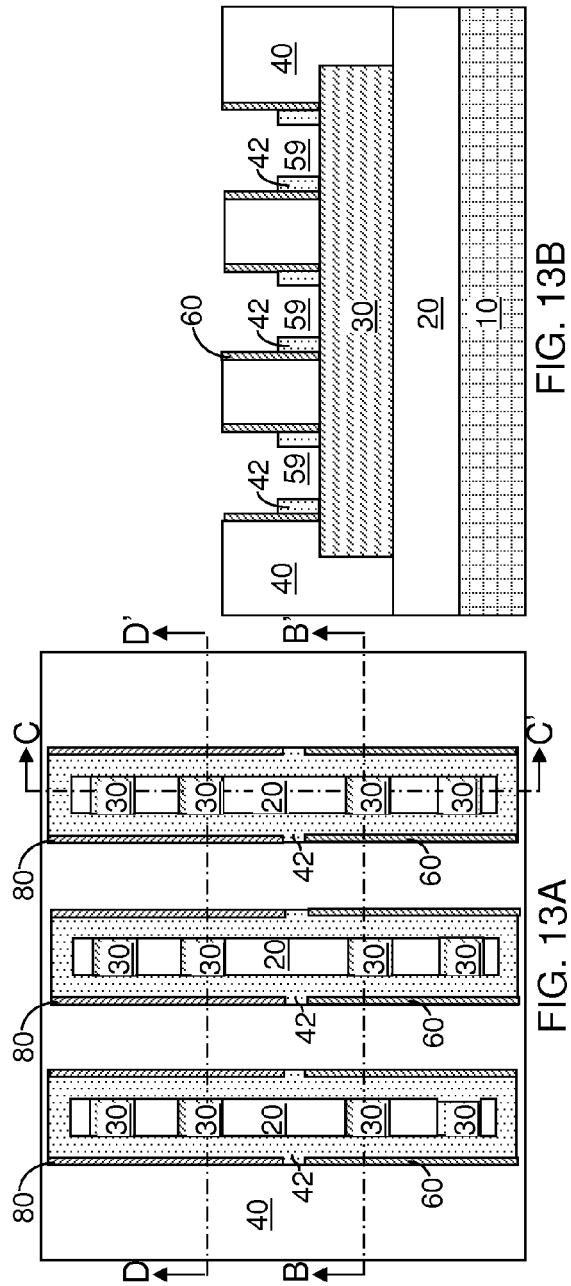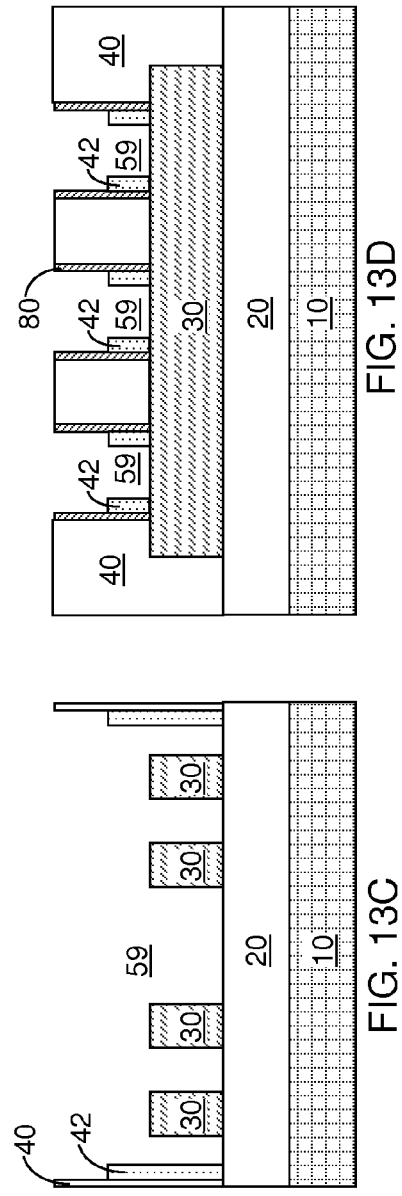
FIG. 13A
FIG. 13B
FIG. 13C
FIG. 13D

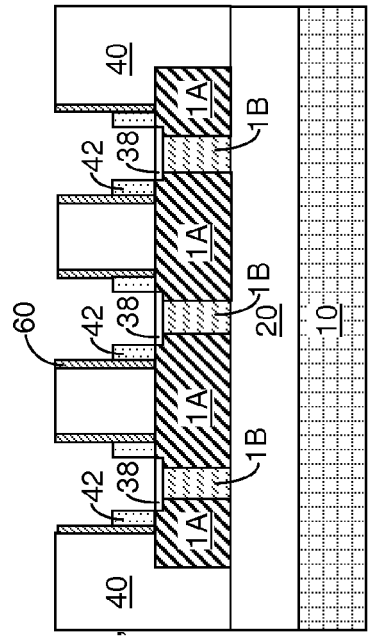
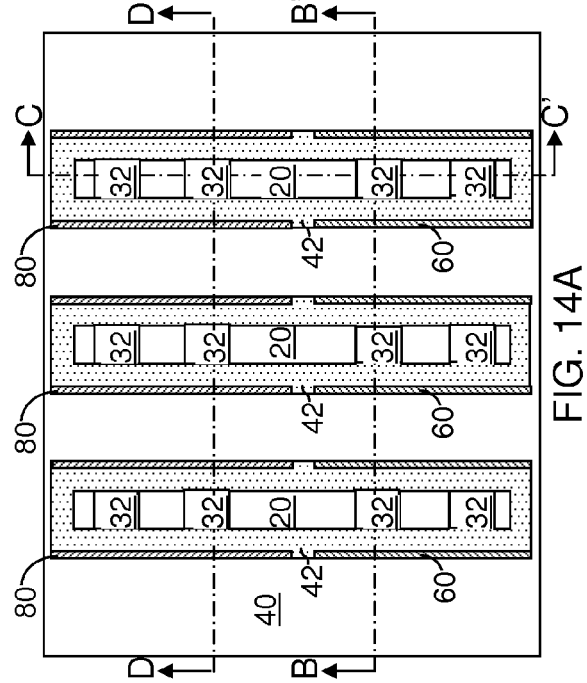
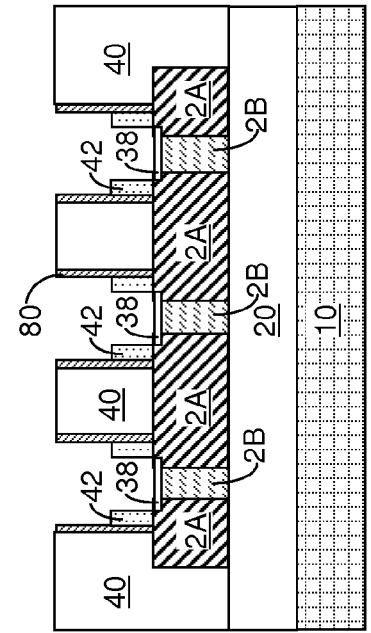
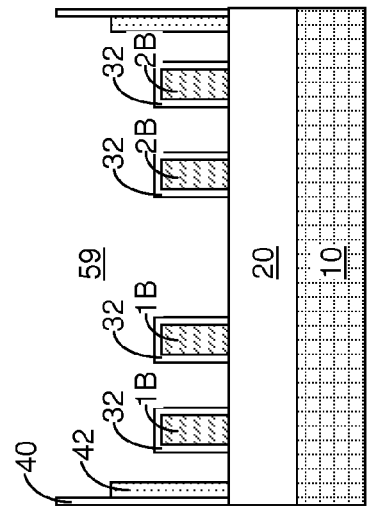

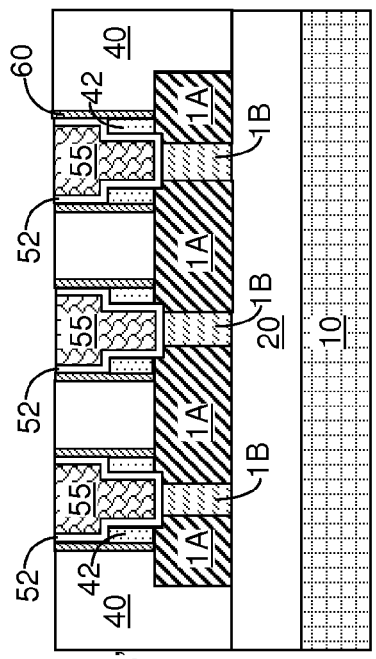
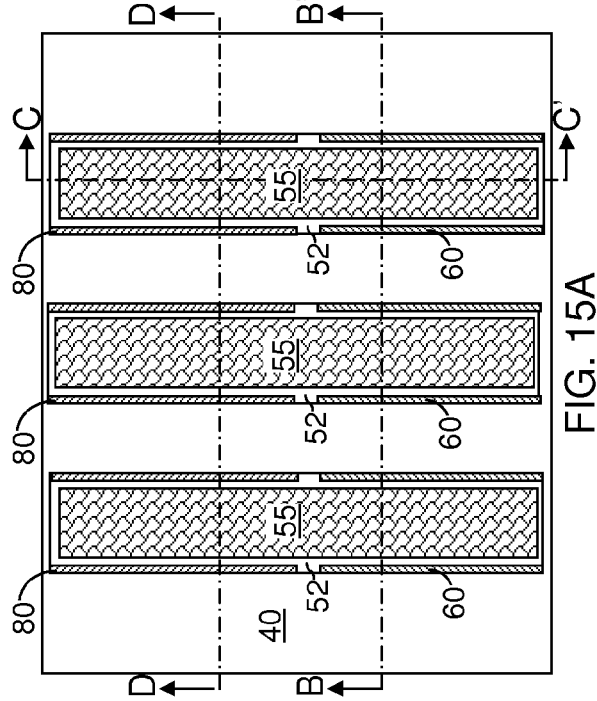
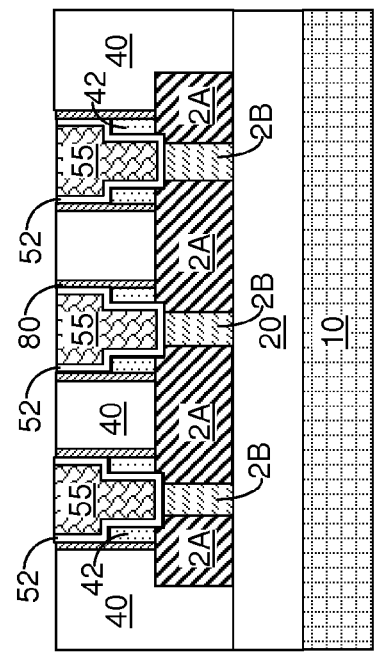
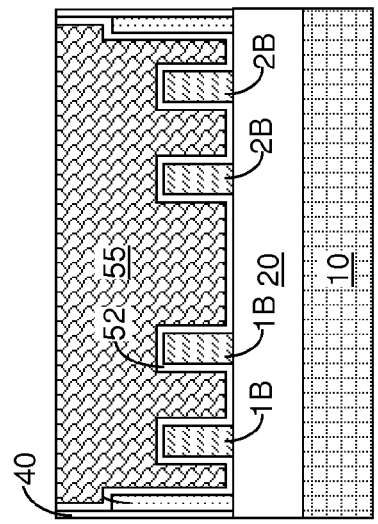
FIG. 15B
FIG. 15D
FIG. 15A
FIG. 15C

FIN FIELD EFFECT TRANSISTOR WITH SELF-ALIGNED SOURCE/DRAIN REGIONS

BACKGROUND

The present disclosure relates to a semiconductor device, and more specifically, a fin field effect transistor employing self-aligned source/drain regions and a method manufacturing the same.

Fin field effect transistors are employed in advanced semiconductor circuits to provide a higher on-current density and enhanced gate control over conventional planar field effect transistors. Typical fin field effect transistors employ raised source/drain regions formed by selective epitaxy. A selective epitaxy process requires simultaneous or alternate flow of reactants and etchants at a well controlled temperature. For this reason, process uniformity of a selective epitaxy process is difficult to maintain with a wafer, and wafer to wafer, during a manufacturing process. Thus, a fin field effect transistor is desired that does not require use of a selective epitaxy process for formation of source/drain regions.

SUMMARY

A gate cavity is formed over a semiconductor fin by forming a disposable gate structure and a planarization dielectric layer over the semiconductor fin, and by removing the disposable gate structure. A doped silicate glass spacer including an electrical dopant is formed on sidewalls of the gate cavity by deposition and an anisotropic etch of a conformal doped silicate glass layer. A gate spacer including a diffusion barrier material is formed on inner sidewalls of the doped silicate glass spacer. A replacement gate structure is formed within the gate cavity, and source/drain regions are formed in portions of the semiconductor fin by outdiffusion of the electrical dopant during an anneal. The source/drain regions are formed within the semiconductor fin, and are self-aligned to the replacement gate electrode.

According to an aspect of the present disclosure, a semiconductor structure includes a semiconductor fin located on a substrate, a gate structure straddling the semiconductor fin and including a gate dielectric and a gate electrode, doped silicate glass spacers straddling the semiconductor fin and laterally contacting vertical sidewalls of the gate dielectric, and source/drain regions located in the semiconductor fin and containing a same electrical dopant as the doped silicate glass spacers.

According to another aspect of the present disclosure, a method of forming a semiconductor structure is provided. A planarization dielectric layer overlying a semiconductor fin is formed on a substrate. A gate cavity straddling the semiconductor fin is formed. Doped silicate glass spacers are formed in the gate cavity. Source/drain regions are formed in the semiconductor fin by outdiffusing dopants from the doped silicate glass spacer by an anneal.

BRIEF DESCRIPTION OF THE SEVERAL VIEWS OF THE DRAWINGS

FIG. 2A is a top-down view of the exemplary semiconductor structure after formation of a planarization dielectric layer and a hard mask layer according to an embodiment of the present disclosure.

FIG. 2B is a vertical cross-sectional view of the exemplary semiconductor structure along the vertical plane B-B' of FIG. 2A.

FIG. 2C is a vertical cross-sectional view of the exemplary semiconductor structure along the vertical plane C-C' of FIG. 2A.

FIG. 2D is a vertical cross-sectional view of the exemplary semiconductor structure along the vertical plane D-D' of FIG. 2A.

FIG. 3A is a top-down view of the exemplary semiconductor structure after patterning of the hard mask layer according to an embodiment of the present disclosure.

FIG. 3B is a vertical cross-sectional view of the exemplary semiconductor structure along the vertical plane B-B' of FIG. 3A.

FIG. 3C is a vertical cross-sectional view of the exemplary semiconductor structure along the vertical plane C-C' of FIG. 3A.

FIG. 3D is a vertical cross-sectional view of the exemplary semiconductor structure along the vertical plane D-D' of FIG. 3A.

FIG. 6A is a top-down view of the exemplary semiconductor structure after an anisotropic etch of the first doped silicate glass layer according to an embodiment of the present disclosure.

FIG. 6B is a vertical cross-sectional view of the exemplary semiconductor structure along the vertical plane B-B' of FIG. 6A.

FIG. 6D is a vertical cross-sectional view of the exemplary semiconductor structure along the vertical plane D-D' of FIG. 6A.

FIG. 11A is a top-down view of the exemplary semiconductor structure after masking the second device region and removing physically exposed portions of the etch stop layer according to an embodiment of the present disclosure.

FIG. 11B is a vertical cross-sectional view of the exemplary semiconductor structure along the vertical plane B-B' of FIG. 11A.

FIG. 11C is a vertical cross-sectional view of the exemplary semiconductor structure along the vertical plane C-C' of FIG. 11A.

FIG. 11D is a vertical cross-sectional view of the exemplary semiconductor structure along the vertical plane D-D' of FIG. 11A.

FIG. 12A is a top-down view of the exemplary semiconductor structure after an anisotropic etch of the second doped silicate glass layer according to an embodiment of the present disclosure.

FIG. 12B is a vertical cross-sectional view of the exemplary semiconductor structure along the vertical plane B-B' of FIG. 12A.

FIG. 12D is a vertical cross-sectional view of the exemplary semiconductor structure along the vertical plane D-D' of FIG. 12A.

FIG. 13A is a top-down view of the exemplary semiconductor structure after formation of a gate spacer according to an embodiment of the present disclosure.

FIG. 13B is a vertical cross-sectional view of the exemplary semiconductor structure along the vertical plane B-B' of FIG. 13A.

FIG. 13C is a vertical cross-sectional view of the exemplary semiconductor structure along the vertical plane C-C' of FIG. 13A.

FIG. 13D is a vertical cross-sectional view of the exemplary semiconductor structure along the vertical plane D-D' of FIG. 13A.

FIG. 14A is a top-down view of the exemplary semiconductor structure after formation of source/drain regions by an anneal according to an embodiment of the present disclosure.

FIG. 14B is a vertical cross-sectional view of the exemplary semiconductor structure along the vertical plane B-B' of FIG. 14A.

FIG. 14C is a vertical cross-sectional view of the exemplary semiconductor structure along the vertical plane B-B' of FIG. 14C.

FIG. 14D is a vertical cross-sectional view of the exemplary semiconductor structure along the vertical plane B-B' of FIG. 14D.

FIG. 15A is a top-down view of the exemplary semiconductor structure after formation of a gate structure according to an embodiment of the present disclosure.

FIG. 15B is a vertical cross-sectional view of the exemplary semiconductor structure along the vertical plane B-B' of FIG. 15A.

FIG. 15C is a vertical cross-sectional view of the exemplary semiconductor structure along the vertical plane C-C' of FIG. 15A.

FIG. 15D is a vertical cross-sectional view of the exemplary semiconductor structure along the vertical plane D-D' of FIG. 15A.

DETAILED DESCRIPTION

Figure 1B:
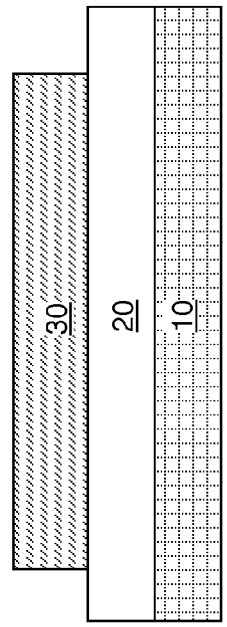
FIG. 1B is a vertical cross-sectional view of the exemplary semiconductor structure along the vertical plane B-B' of FIG. 1A.

As stated above, the present disclosure relates to a fin field effect transistor employing self-aligned source/drain regions and a method manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Figure 1D:
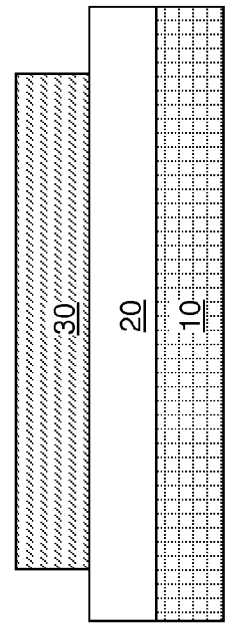
FIG. 1D is a vertical cross-sectional view of the exemplary semiconductor structure along the vertical plane D-D' of FIG. 1A.
Figure 1A:
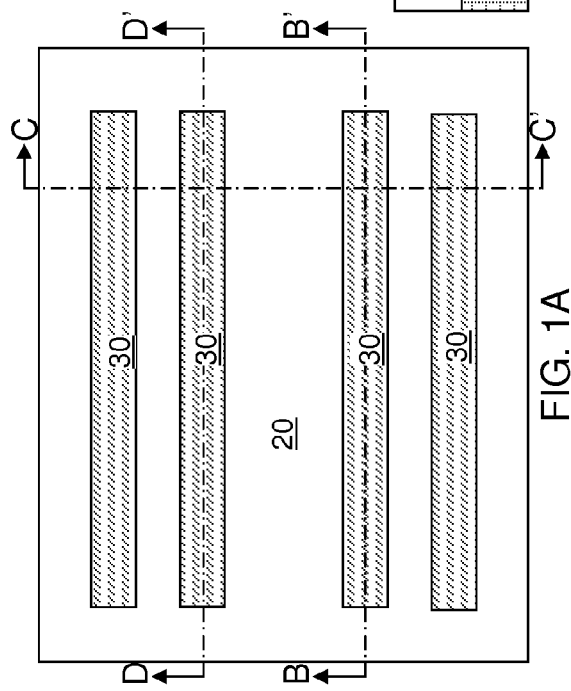
FIG. 1A is a top-down view of an exemplary semiconductor structure after formation of semiconductor fins on an insulator layer according to an embodiment of the present disclosure.
Figure 1C:
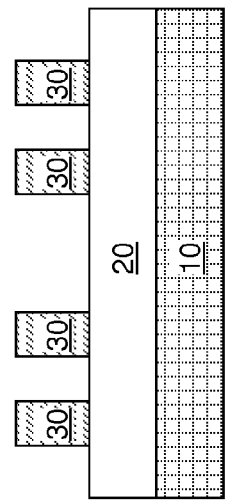
FIG. 1C is a vertical cross-sectional view of the exemplary semiconductor structure along the vertical plane C-C' of FIG. 1A.

Referring to FIGS. 1A-1D, an exemplary semiconductor structure according to an embodiment of the present disclosure includes semiconductor fins 30 formed on a substrate (10, 20). As used herein, a "semiconductor fin" refers to a semiconductor material portion having a parallel pair of vertical sidewalls. In one embodiment, the height of a semiconductor fin, i.e., the height of the pair of vertical sidewalls, can be greater than width of the semiconductor fin. Each semiconductor fin 30 can extend along a direction parallel to the parallel pair of vertical sidewalls, which is herein referred to as a "lengthwise direction" of the semiconductor fin.

A top portion of the substrate (10, 20) includes an insulator material. In one embodiment, the substrate (10, 20) can include, from bottom to top, a handle substrate 10 and an insulator layer 20. In one embodiment, the exemplary semiconductor structure can be formed by providing a semiconductor-on-insulator (SOI) substrate including the handle substrate 10, the insulator layer 20, and a top semiconductor layer, and patterning the top semiconductor layer into semiconductor fins 30 by a combination of lithographic patterning and an anisotropic etch as known in the art. In another embodiment, the substrate (10, 20) can be replaced with a bulk semiconductor substrate consisting of a semiconductor material.

The semiconductor fins 30 includes a semiconductor material, which can be an elemental semiconductor material such as silicon or germanium; a semiconductor alloy of Group IV elements such as a silicon-germanium alloy, a silicon-carbon alloy, or a silicon-germanium-carbon alloy; a compound semiconductor material; or an organic semiconductor material. In one embodiment, the entirety of each semiconductor fin 30 can be single crystalline. In one embodiment, the semiconductor fins 30 can be single crystalline silicon fins. The height of the semiconductor fins 30 can be in a range from 30 nm to 300 nm, although lesser and greater thicknesses can also be employed.

Referring to FIGS. 2A-2D, a planarization dielectric layer 40 is formed over the semiconductor fins 30. The planarization dielectric layer 40 includes a dielectric material such as silicon oxide, silicon nitride, spin-on glass (SOG), and/or organosilicate glass (OSG). In one embodiment, the planarization dielectric layer 40 includes a self-planarizing material. In another embodiment, the top surface of the planarization dielectric layer 40 can be planarized, for example, by chemical mechanical planarization (CMP). The top surface of the planarization dielectric layer is located above a horizontal plane including topmost surfaces of the semiconductor fins 30. The thickness of the planarization dielectric layer 40, as measured from the top surface of the insulator layer 20, can be in a range from 60 nm to 600 nm, although lesser and greater thicknesses can also be employed.

A hard mask layer 50 is subsequently formed on the top surface of the planarization dielectric layer 40. The hard mask layer 50 can include a dielectric material different from the material of the planarization dielectric layer 40, or can include a metallic material. For example, the hard mask layer 50 can include silicon nitride or a metallic nitride. The hard mask layer 50 can be deposited as a blanket layer, i.e., an unpatterned layer, having a uniform thickness throughout. The thickness of the hard mask layer 50 can be in a range from 3 nm to 60 nm, although lesser and greater thicknesses can also be employed.

Referring to FIGS. 3A-3D, the hard mask layer 50 is patterned to form at least one opening therein. The shape of each opening is selected such that the area of the opening straddles at least one semiconductor fin 30. The area of each opening coincides with the area in which a gate structure including a gate dielectric and a gate electrode, and spacer, is to be subsequently formed. The at least one opening in the hard mask layer 50 can be formed, for example, by applying and patterning a photoresist layer (not shown) over the hard mask layer 50, lithographically patterning the photoresist layer, and transferring the pattern in the photoresist layer through the hard mask layer 50 by an anisotropic etch that employs the photoresist layer as an etch mask. The photoresist layer can be subsequently removed, for example, by ashing. In one embodiment, the area of an opening can straddle a plurality of semiconductor fins 30.

Figures 4A, 4B, 4C, 4D:
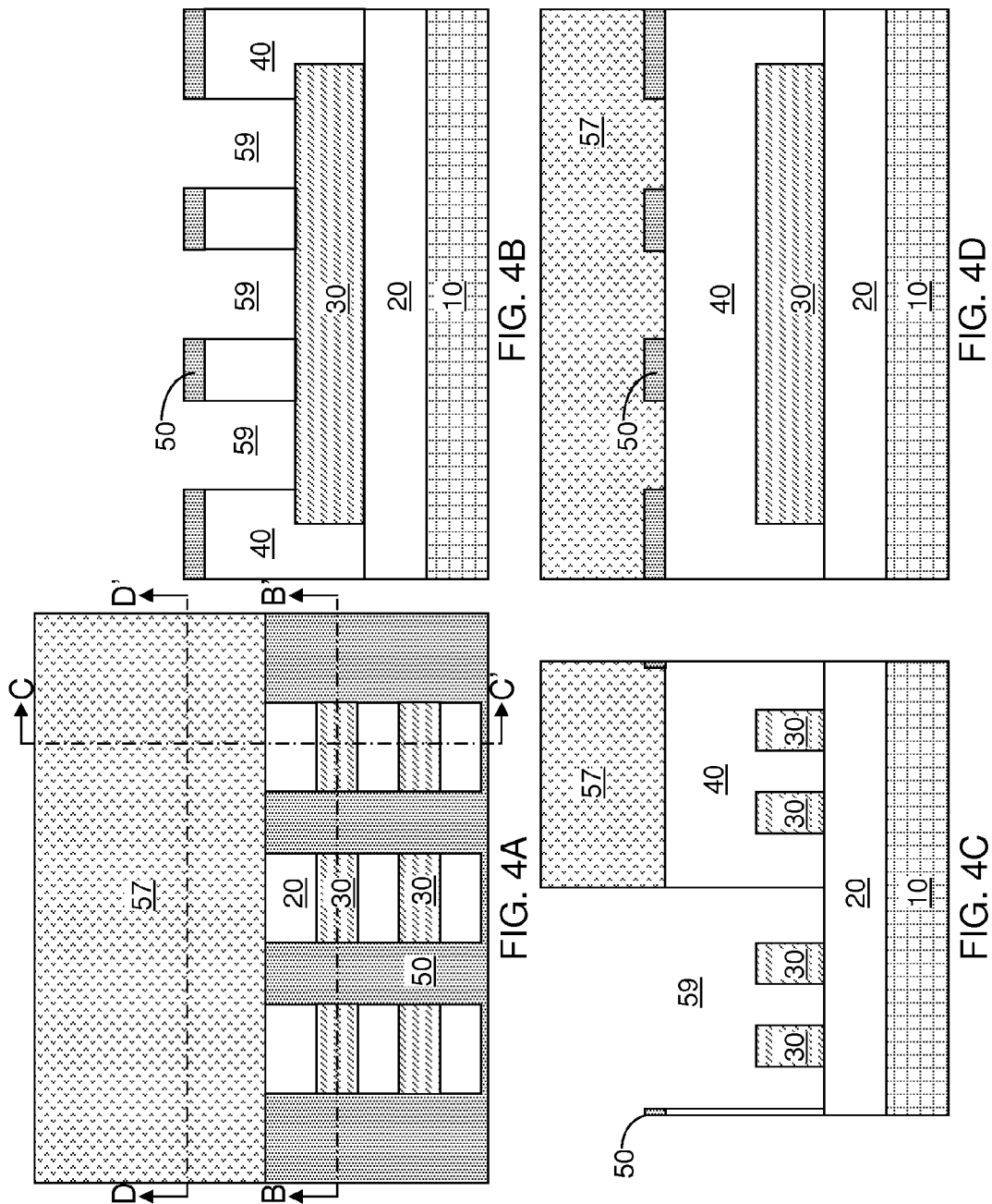
FIG. 4A is a top-down view of the exemplary semiconductor structure after masking of a second device region and etching of the planarization dielectric layer in a first device region according to an embodiment of the present disclosure.
FIG. 4B is a vertical cross-sectional view of the exemplary semiconductor structure along the vertical plane B-B' of FIG. 4A.
FIG. 4C is a vertical cross-sectional view of the exemplary semiconductor structure along the vertical plane C-C' of FIG. 4A.
FIG. 4D is a vertical cross-sectional view of the exemplary semiconductor structure along the vertical plane D-D' of FIG. 4A.

Referring to FIGS. 4A-4D, a first photoresist layer 57 is applied over the hard mask layer 57, and is lithographically patterned to mask one area while not masking another area. The unmasked area is herein referred to as a first device region, and the mask area is herein referred to as a second device region. The first device region includes the area of at least one semiconductor fin 30, and can include a portion of an opening in the hard mask layer 50.

An anisotropic etch process can be performed to etch physically exposed portions of the planarization dielectric layer 40 that are not covered by the combination of the first photoresist layer 57 and the hard mask layer 50. A gate cavity 59 extending to the top surface of the insulator layer 20 is formed in each area that is not covered by the combination of the first photoresist layer 57 and the hard mask layer 50. The first photoresist layer 57 is subsequently removed, for example, by ashing. Each gate cavity 59 can straddle a single semiconductor fin 30 or a plurality of semiconductor fins 30.

Figure 5B:
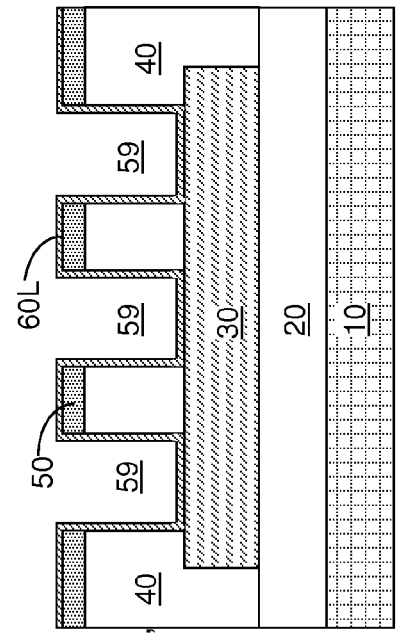
FIG. 5B is a vertical cross-sectional view of the exemplary semiconductor structure along the vertical plane B-B' of FIG. 5A.
Figure 5D:
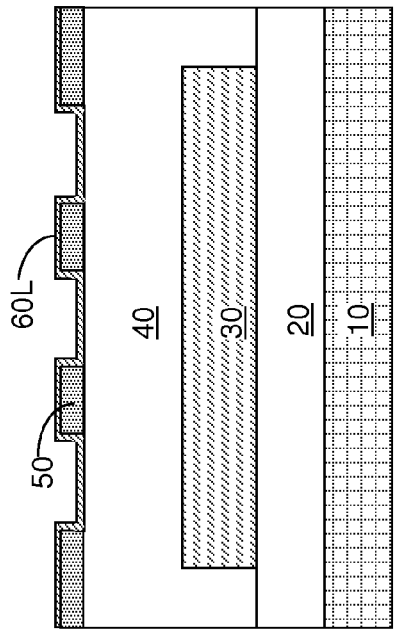
FIG. 5D is a vertical cross-sectional view of the exemplary semiconductor structure along the vertical plane D-D' of FIG. 5A.
Figure 5A:
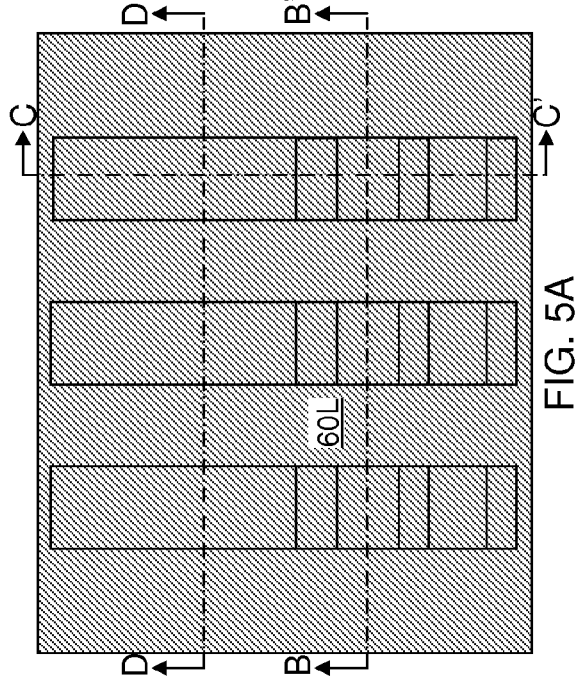
FIG. 5A is a top-down view of the exemplary semiconductor structure after formation of a first doped silicate glass layer according to an embodiment of the present disclosure.
Figure 5C:
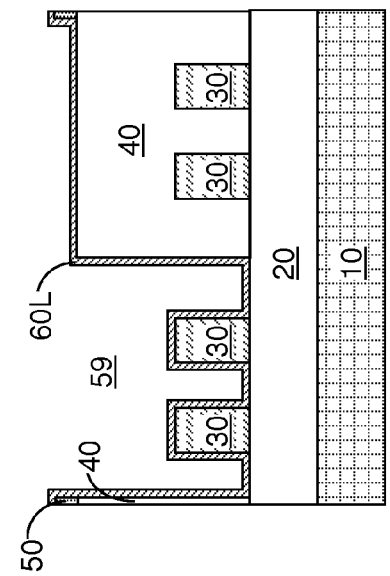
FIG. 5C is a vertical cross-sectional view of the exemplary semiconductor structure along the vertical plane C-C' of FIG. 5A.

Referring to FIGS. 5A-5D, a first doped silicate glass layer 60L is deposited on the surfaces the semiconductor fins 30, the planarization dielectric layer 40, and the hard mask layer 50. The first doped silicate glass layer 60L includes a doped silicate glass material that includes an electrical dopant. The electrical dopant can be a p-type dopant such as B, or an n-type dopant such as P or As. Thus, the first doped silicate glass layer 60L can include borosilicate glass (BSG), phosphosilicate glass (PSG), or arsenosilicate glass (ASG). The conductivity type of the electrical dopant is herein referred to as a first conductivity type, which can be p-type or n-type.

The first doped silicate glass layer 60L can be deposited as a conformal material layer employing a conformal deposition method, which can be, for example, chemical vapor deposition (CVD). The thickness of the first doped silicate glass layer 60L can be in a range from 3 nm to 30 nm, although lesser and greater thicknesses can also be employed.

Figure 6E:
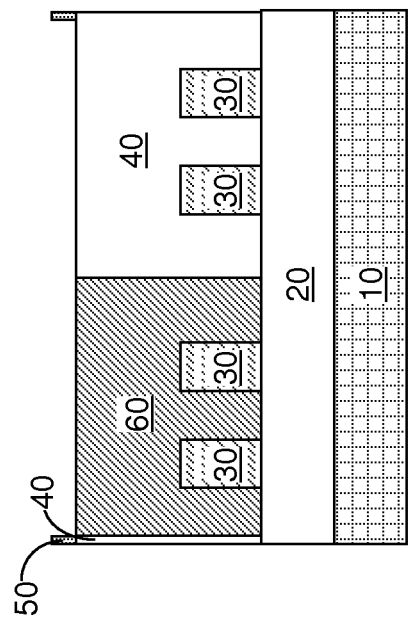
FIG. 6E is a vertical cross-sectional view of the exemplary semiconductor structure along the vertical plane E-E' of FIG. 6A.
Figure 6C:
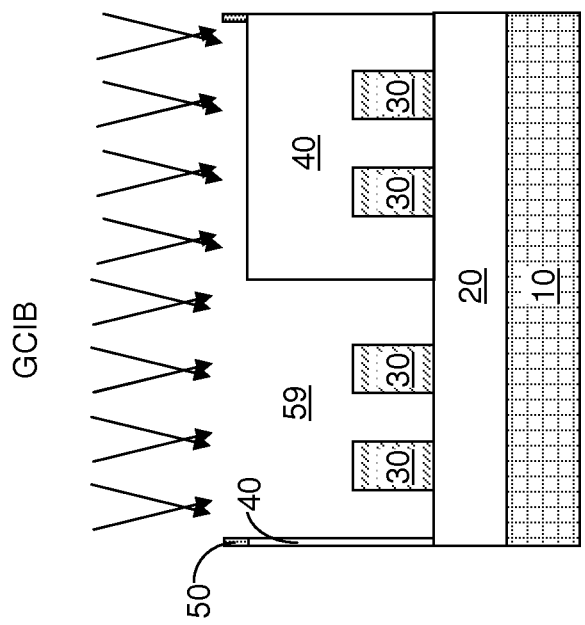
FIG. 6C is a vertical cross-sectional view of the exemplary semiconductor structure along the vertical plane C-C' of FIG. 6A.

Referring to FIGS. 6A-6E, an anisotropic etch process can be performed to anisotropically etch the first doped silicate glass layer 60L. In one embodiment, the anisotropic etching of the first doped silicate glass layer 60L can be performed employing a gas cluster ion beam including an etchant gas.

The etchant gas can be a hydrofluorocarbon gas or a fluorocarbon gas such as $CF_4$, $CH_2F_2$, $CHF_3$, or $C_lH_mF_n$, in which l is an integer greater than 1, and m and n are positive integers. Etchant gas clusters impinge on the first doped silicate glass layer 60L along directions perpendicular to the lengthwise direction of the semiconductor fins 30, e.g., along the directions labeled "GCIB" in FIGS. 6A and 6C. Use of the gas cluster ion beam including an etchant gas for the anisotropic etch process has the effect of removing the first doped silicate glass layer 60L from the portions of the surfaces of the semiconductor fins 30 that are laterally spaced from the sidewalls of the planarization dielectric layer 40 by a distance greater than the thickness of the first doped silicate glass layer 60L.

The remaining portions of the first doped silicate glass layer 60L within each gate cavity 59 include two disjoined portions that contact sidewalls of the planarization dielectric layer 40 that are perpendicular to the lengthwise direction of the semiconductor fins 30. As used herein, two elements are "disjoined" from each other if the two elements are separate structures that do not contact each other. Each remaining contiguous portion of the first doped silicate glass layer 60L is herein referred to as a first doped silicate glass spacer 60. Thus, within each gate cavity 59, the first doped silicate glass spacers 60 are formed as a pair of disjoined structures that do not contact each other. The thickness of each first doped silicate glass spacer 60 can be the same as the thickness of the first doped silicate glass layer 60L.

Figure 7B:
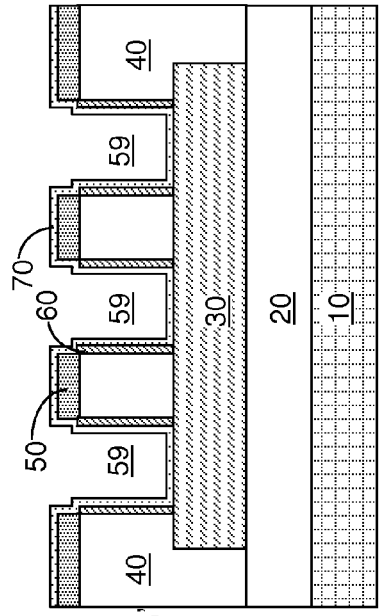
FIG. 7B is a vertical cross-sectional view of the exemplary semiconductor structure along the vertical plane B-B' of FIG. 7A.
Figure 7D:
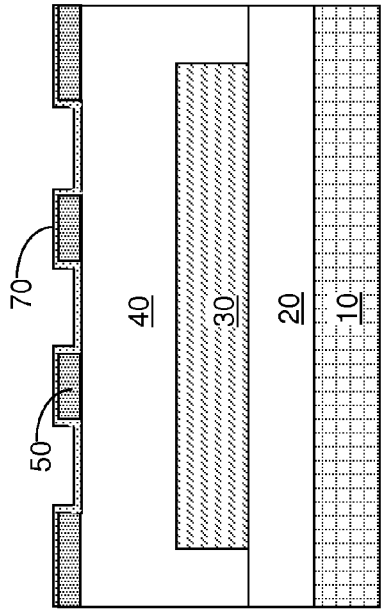
FIG. 7D is a vertical cross-sectional view of the exemplary semiconductor structure along the vertical plane D-D' of FIG. 7A.
Figure 7A:
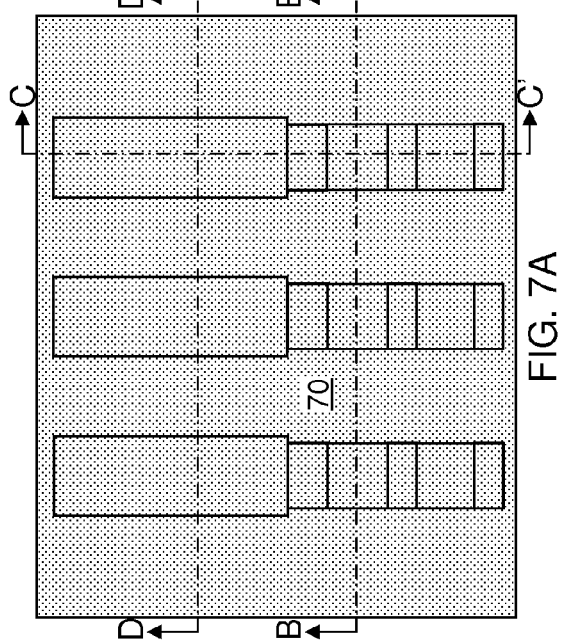
FIG. 7A is a top-down view of the exemplary semiconductor structure after formation of an etch stop layer according to an embodiment of the present disclosure.
Figure 7C:
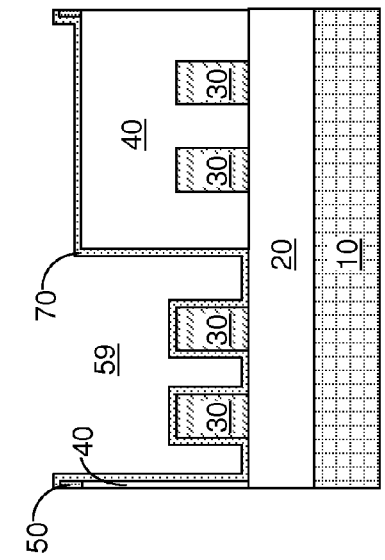
FIG. 7C is a vertical cross-sectional view of the exemplary semiconductor structure along the vertical plane C-C' of FIG. 7A.

Referring to FIGS. 7A-7D, an etch stop layer 70 can be subsequently formed on the first doped silicate glass spacers 60, the planarization dielectric layer 40, and the hard mask layer 50. The etch stop layer 70 includes a material that can function as an etch stop material during an etch of a silicate glass. For example, the etch stop layer 70 can include silicon nitride or a dielectric metal oxide having a dielectric constant greater than 8.0. The etch stop layer 70 can be deposited by a conformal deposition method such as chemical vapor deposition. The thickness of the etch stop layer 70 can be in a range from 3 nm to 30 nm, although lesser and greater thicknesses can also be employed.

Figure 8A:
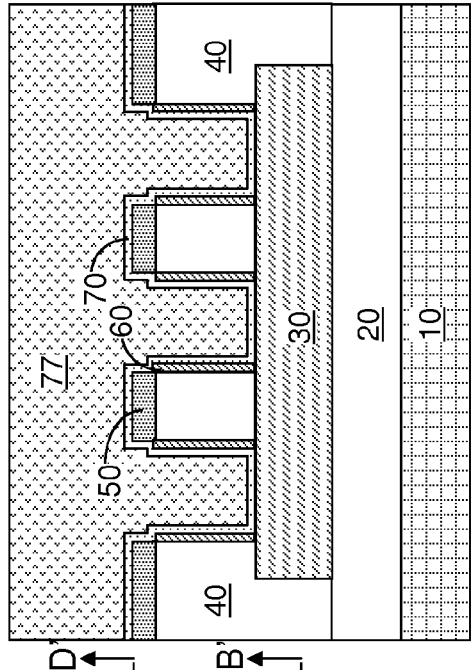
FIG. 8A is a top-down view of the exemplary semiconductor structure after removal of the etch stop layer and the first doped silicate glass layer from the second device region while the first device region is masked according to an embodiment of the present disclosure.
Figure 8B:
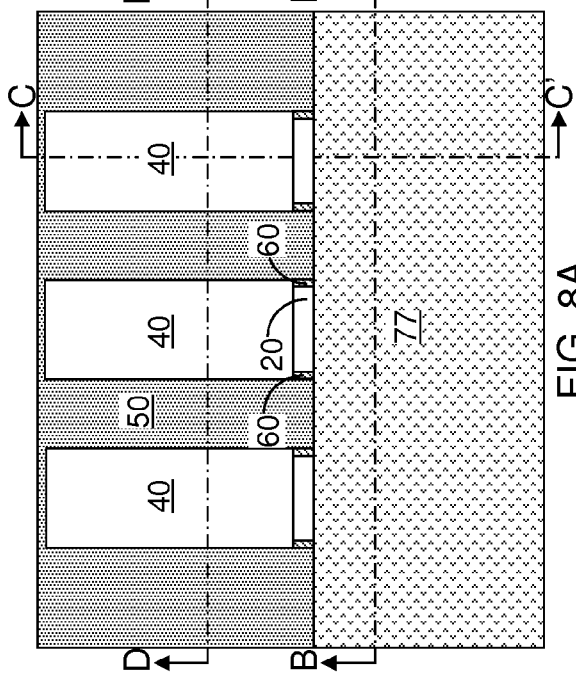
FIG. 8B is a vertical cross-sectional view of the exemplary semiconductor structure along the vertical plane B-B' of FIG. 8A.
Figure 8C:
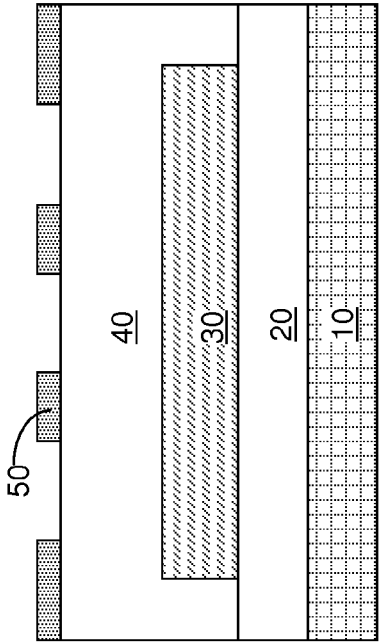
FIG. 8C is a vertical cross-sectional view of the exemplary semiconductor structure along the vertical plane C-C' of FIG. 8A.
Figure 8D:
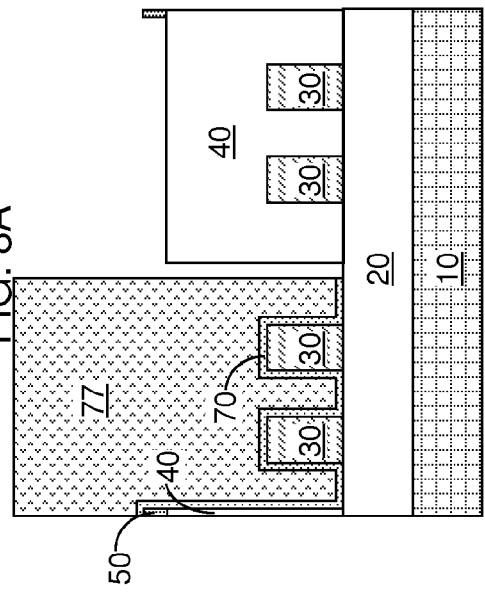
FIG. 8D is a vertical cross-sectional view of the exemplary semiconductor structure along the vertical plane D-D' of FIG. 8A.

Referring to FIGS. 8A-8D, a second photoresist layer 77 is applied over the hard mask layer 77, and is lithographically patterned to mask the second device region, while not masking the first device region. In one embodiment, peripheral portions of the first doped silicate glass spacers 60 in proximity to the first device region may be physically exposed due to overlay variations during lithographic patterning of the second photoresist layer 77.

Physically exposed portions of the etch stop layer 70 can be removed, for example, by an isotropic etch. The isotropic etch can be, for example, a wet etch that is selective to the dielectric material of the planarization dielectric layer.

Figure 9B:
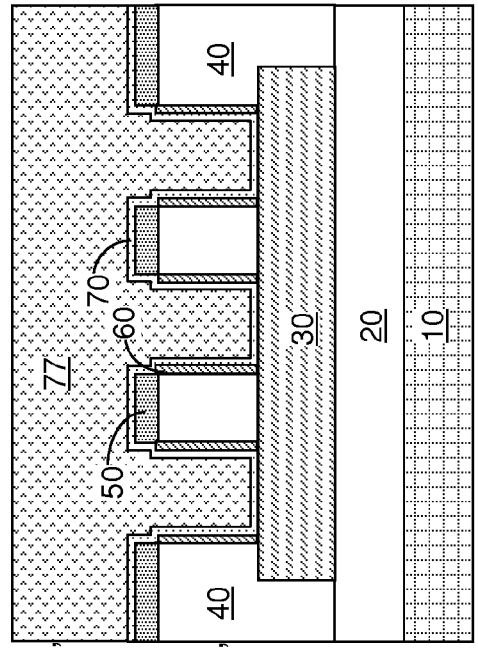
FIG. 9B is a vertical cross-sectional view of the exemplary semiconductor structure along the vertical plane B-B' of FIG. 9A.
Figure 9D:
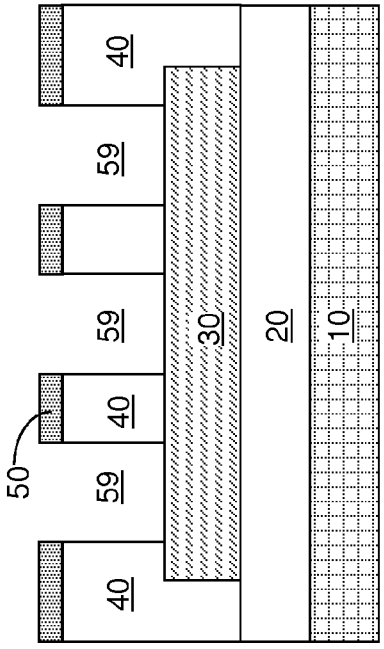
FIG. 9D is a vertical cross-sectional view of the exemplary semiconductor structure along the vertical plane D-D' of FIG. 9A.
Figure 9A:
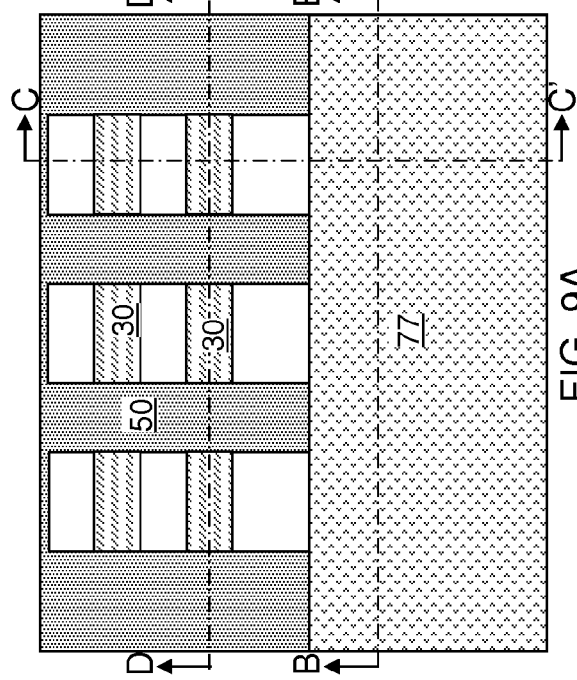
FIG. 9A is a top-down view of the exemplary semiconductor structure after anisotropically etching the physically exposed portions of the planarization dielectric layer in the second device region according to an embodiment of the present disclosure.
Figure 9C:
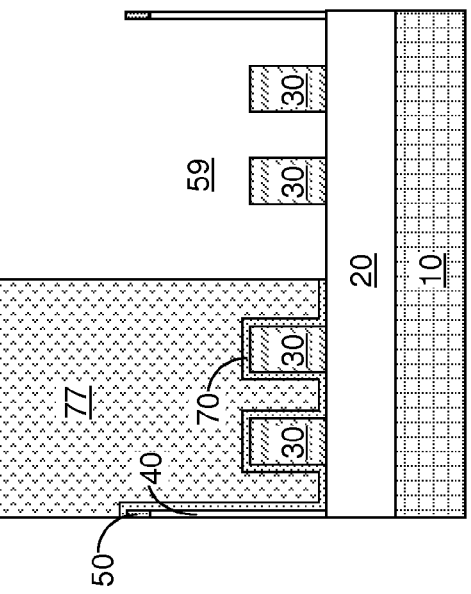
FIG. 9C is a vertical cross-sectional view of the exemplary semiconductor structure along the vertical plane C-C' of FIG. 9A.

Referring to FIGS. 9A-9D, an anisotropic etch process can be performed to etch physically exposed portions of the planarization dielectric layer 40 that are not covered by the combination of the second photoresist layer 77 and the hard mask layer 50. The gate cavity 59 extends to the top surface of the insulator layer 20 in each area that is not covered by the combination of the second photoresist layer 77 and the hard mask layer 50. The second photoresist layer 77 is subsequently removed, for example, by ashing. Each gate cavity 59 not filled by the second photoresist layer 77 can straddle a single semiconductor fin 30 or a plurality of semiconductor fins 30. The second photoresist layer 77 can be subsequently removed, for example, by ashing.

Figure 10A:
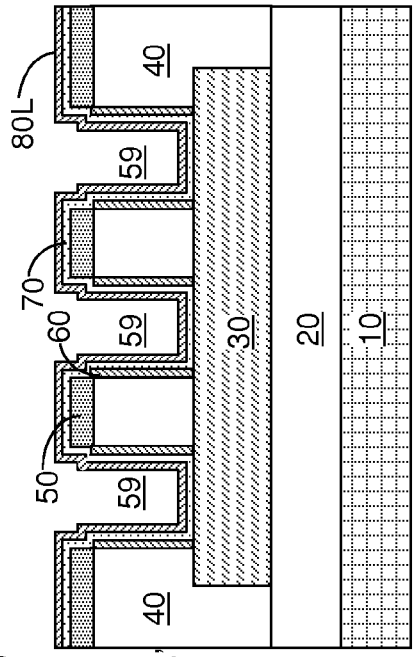
FIG. 10A is a top-down view of the exemplary semiconductor structure after deposition of a second doped silicate glass layer according to an embodiment of the present disclosure.
Figure 10B:
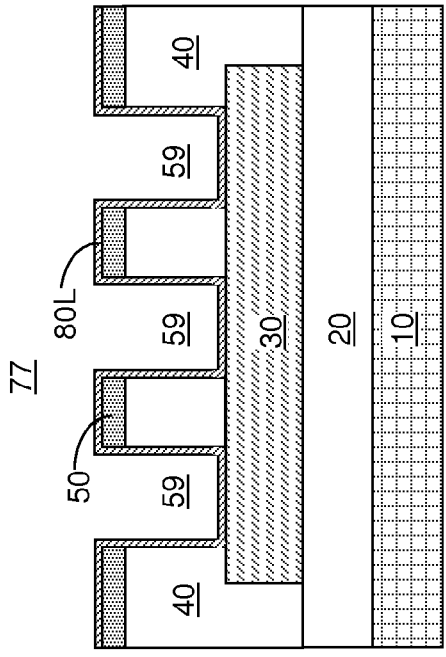
FIG. 10B is a vertical cross-sectional view of the exemplary semiconductor structure along the vertical plane B-B' of FIG. 10A.
Figure 10C:
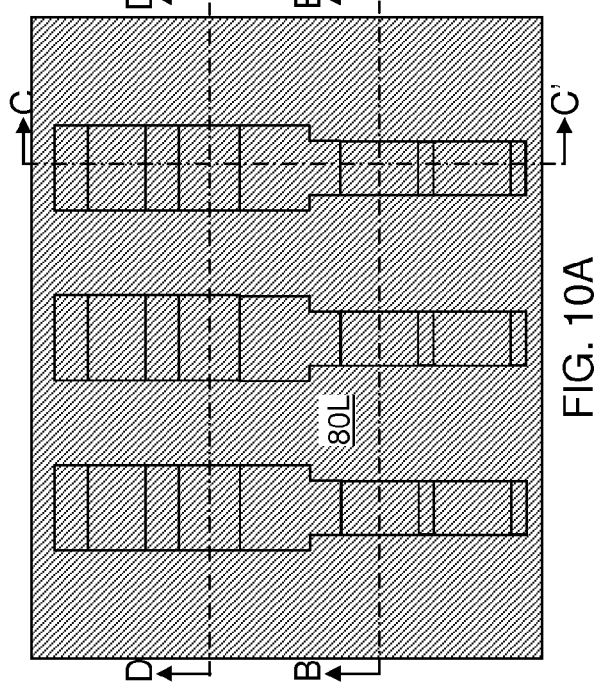
FIG. 10C is a vertical cross-sectional view of the exemplary semiconductor structure along the vertical plane C-C' of FIG. 10A.
Figure 10D:
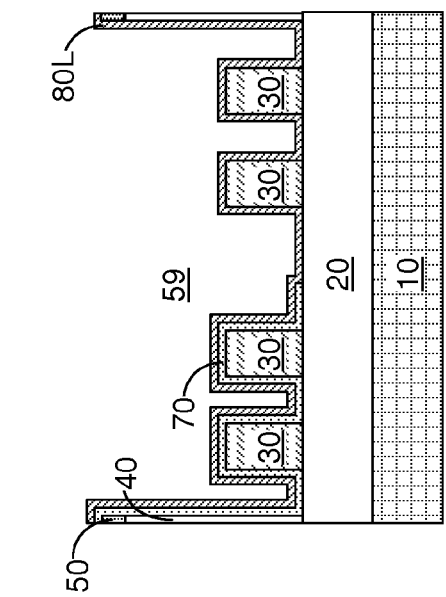
FIG. 10D is a vertical cross-sectional view of the exemplary semiconductor structure along the vertical plane D-D' of FIG. 10A.

Referring to FIGS. 10A-10D, a second doped silicate glass layer 80L is deposited on the physically exposed surfaces the semiconductor fins 30, the planarization dielectric layer 40, the etch stop layer 70, and the hard mask layer 50. The second doped silicate glass layer 80L includes a doped silicate glass material that includes an electrical dopant having an opposite type of conductivity of the electrical dopant in the first doped silicate glass spacers 60. The electrical dopant can be a p-type dopant such as B, or an n-type dopant such as P or As. Thus, the second doped silicate glass layer 80L can include borosilicate glass (BSG), phosphosilicate glass (PSG), or arsenosilicate glass (ASG). The conductivity type of the electrical dopant in the second doped silicate glass layer 80L is herein referred to as a second conductivity type, which is the opposite of the first conductivity type. For example, if the first conductivity type is p-type, the second conductivity type is n-type, and vice versa.

The second doped silicate glass layer 80L can be deposited as a conformal material layer employing a conformal deposition method, which can be, for example, chemical vapor deposition (CVD). The thickness of the second doped silicate glass layer 80L can be in a range from 3 nm to 30 nm, although lesser and greater thicknesses can also be employed.

Referring to FIGS. 11A-11D, a third photoresist layer 87 is applied and lithographically patterned to cover the second device region while not covering the first device region. Subsequently, physically exposed portions of the second doped silicate glass layer 80L is etched by an isotropic etch selective to the etch stop layer 70. For example, the isotropic etch can be a wet etch employing hydrofluoric acid. Thus, the second doped silicate glass layer 80L is removed from above the etch stop layer 70 in the first device region, while the portion of the second doped silicate glass layer 80L underneath the third photoresist layer 87 is protected from the isotropic etch by the third photoresist layer 87. The third photoresist layer 87 is subsequently removed, for example, by ashing.

Figure 12E:
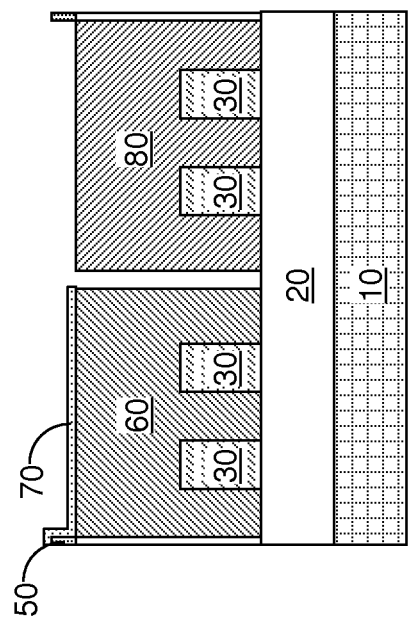
FIG. 12E is a vertical cross-sectional view of the exemplary semiconductor structure along the vertical plane E-E' of FIG. 12A.
Figure 12C:
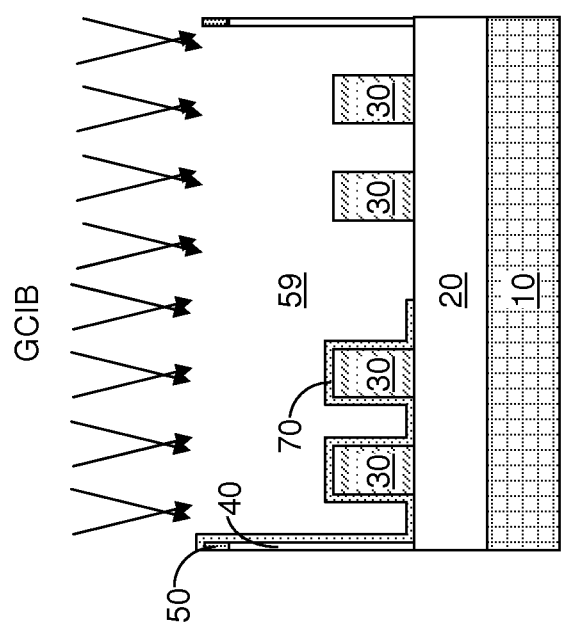
FIG. 12C is a vertical cross-sectional view of the exemplary semiconductor structure along the vertical plane C-C' of FIG. 12A.

Referring to FIGS. 12A-12E, an anisotropic etch process can be performed to anisotropically etch the second doped silicate glass layer 80L. In one embodiment, the anisotropic etching of the second doped silicate glass layer 80L can be performed employing a gas cluster ion beam including an etchant gas. The etchant gas can be a hydrofluorocarbon gas or a fluorocarbon gas such as $CF_4$, $CH_2F_2$, $CHF_3$, or $C_pH_qF_r$, in which p is an integer greater than 1, and q and r are positive integers. Etchant gas clusters impinge on the second doped silicate glass layer 80L along directions perpendicular to the lengthwise direction of the semiconductor fins 30, e.g., along the directions labeled "GCIB" in FIGS. 12A and 12C. Use of the gas cluster ion beam including an etchant gas for the anisotropic etch process has the effect of removing the second doped silicate glass layer 80L from the portions of the surfaces of the semiconductor fins 30 that are laterally spaced from the sidewalls of the planarization dielectric layer 40 by a distance grater than the thickness of the second doped silicate glass layer 80L.

The remaining portions of the second doped silicate glass layer 80L within each gate cavity 59 include two disjoined portions that contact sidewalls of the planarization dielectric layer 40 that are perpendicular to the lengthwise direction of the semiconductor fins 30. Each remaining contiguous portion of the second doped silicate glass layer 80L is herein referred to as a second doped silicate glass spacer 80. Thus, within each gate cavity 59, the second doped silicate glass spacers 80 can be formed as a pair of disjoined structures that do not contact each other. The thickness of each second doped silicate glass spacer 80 can be the same as the thickness of the second doped silicate glass layer 80L.

Referring to FIGS. 13A-13D, the etch stop layer 70 can be optionally removed selective to the first and second doped silicate glass spacers (60, 80), the planarization dielectric layer 40, and the semiconductor fins 30. For example, if the etch stop layer 70 includes silicon nitride, a wet etch employing hot phosphoric acid can be employed to remove the etch stop layer 70.

Further, the hard mask layer 50 can be removed selective to the first and second doped silicate glass spacers (60, 80), the planarization dielectric layer 40, and the semiconductor fins 30. For example, if the hard mask layer 50 includes silicon nitride, a wet etch employing hot phosphoric acid can be employed to remove the hard mask layer 50. In one embodiment, the removal of the etch stop layer 70 and the hard mask layer 50 can be performed employing a same etch chemistry or different etch chemistries.

A gate spacer 42 can be formed by deposition of a conformal dielectric layer and an anisotropic etch that removes horizontal portions of the conformal dielectric layer. Further, an overetch is performed during the anisotropic etch so that vertical portions of the conformal dielectric layer are removed from sidewalls of the semiconductor fins 30. Each remaining portion of the conformal dielectric layer constitutes a gate spacer 42.

In one embodiment, each gate spacer 42 can be formed around a periphery of each gate cavity 59 as a single contiguous structure with an opening therein. In this case, each gate spacer 42 can contact sidewalls of the first and second doped silicate glass spacers (60, 80), and sidewalls of the planarization dielectric layer 40. The topmost portion of each gate spacer 42 can be recessed, or equal height, with respect to the top surface of the planarization dielectric layer 40. Each gate spacer 42 can be a contiguous structure including an opening therethrough. Each gate spacer 42 can be formed on inner sidewalls of the first and second doped silicate glass spacers (60, 80). As used herein, an "inner" sidewall of a spacer refers to a sidewall that is more proximal to a geometrical center of a cavity in which the spacer is located.

The gate spacers 42 include a dielectric material different from the material of the planarization dielectric layer 40. In one embodiment, the gate spacers 42 can include silicon nitride. The conformal dielectric layer can be deposited by a conformal deposition method such as chemical vapor deposition (CVD). The thickness of the gate spacers 42 can be in a range from 3 nm to 60 nm, although lesser and greater thicknesses can also be employed.

Referring to FIGS. 14A-14D, source/drain regions (1A, 2A) are formed in the semiconductor fins 30 (See FIGS. 15A-15D) by outdiffusing dopants from the doped silicate glass spacers (60, 80) by an anneal. As used herein, "source/drain regions" collectively refer to source regions and drain regions. First type source/drain regions 1A having a doping of the first conductivity type is formed in the first device region, and second type source/drain regions 2A having a doping of the second conductivity type is formed in the second device region. Specifically, portions of the semiconductor fins 30 in the first device region that are in contact with, or in proximity with, the first doped silicate glass spacers 60 are converted into the first type source/drain regions 1A as dopants of the first conductivity type diffuse out of the first doped silicate glass spacers during the anneal. Portions of the semiconductor fins 30 in the second device region that are in contact with, or in proximity with, the second doped silicate glass spacers 80 are converted into the second type source/drain regions 2A as dopants of the second conductivity type diffuse out of the second doped silicate glass spacers during the anneal.

Portions of the semiconductor fins 30 in the first device region that are not converted into the first type source/drain regions 1A constitute first type body regions 1B. The first type body regions can have a doping of the second conductivity type, or can be intrinsic. Portions of the semiconductor fins 30 in the second device region that are not converted into the second type source/drain regions 2A constitute second type body regions 2B. The second type body regions can have a doping of the first conductivity type, or can be intrinsic.

The temperature and duration of the anneal process that induces outdiffusion of the dopants from the first and second doped silicate glass spacers (60, 80) can be selected so that the outdiffused dopants can diffuse to the target boundary for the various source/drain regions (1A, 1B). The anneal process can be performed in vacuum, in an inert ambient, or in an oxidizing ambient.

In one embodiment, the anneal process can be performed in an oxidizing ambient so that physically exposed portions of the semiconductor fins (1A, 2A, 1B, 2B) can be thinned underneath the gate cavities 59. In one embodiment, the composition of the oxidizing ambient and the duration and the temperature of the anneal process can be selected so that the body regions (1B, 2B) reach a target thickness and/or a target height. Semiconductor oxide portions 38 can be formed on the surfaces of the body regions (1B, 2B) and the peripheral portions of the source/drain regions (1A, 2A) that are physically exposed to the oxidizing ambient during the anneal. The semiconductor oxide portions 38 can be subsequently removed, for example, by an isotropic etch so that the top surface and the sidewall surfaces of the body regions (1B, 2B) are physically exposed in the gate cavities 59.

Referring to FIGS. 15A-15D, a gate structure (52, 55) including a stack of a gate dielectric 52 and a gate electrode 55 can be formed within each gate cavity 59. Each gate structure (52, 55) can be formed directly on a gate spacer 42 and doped silicate glass spacers (60, 80). For example, a gate dielectric layer and at least one conductive material layer can be consecutively deposited to fill the gate cavities 59, and excess portions of the gate dielectric layer and the at least one conductive material layer can be removed from above the top surface of the planarization dielectric layer, for example, by chemical mechanical planarization (CMP). Each remaining portion of the gate dielectric layer constitutes a gate dielectric 52, and each remaining portion of the at least one conductive material layer constitutes a gate electrode 55.

The exemplary semiconductor structure includes at least a semiconductor fin {(1A, 1B) or (2A, 2B)} located on a substrate (10, 20), a gate structure (52, 55) straddling the semiconductor fin {(1A, 1B) or (2A, 2B)} and including a gate dielectric 52 and a gate electrode 55, doped silicate glass spacers (60 or 80) straddling the semiconductor fin {(1A, 1B) or (2A, 2B)} and laterally contacting vertical sidewalls of the gate dielectric 52, and source/drain regions (1A or 2A) located in the semiconductor fin {(1A, 1B) or (2A, 2B)} and containing a same electrical dopant as the doped silicate glass spacers (60 or 80). The same electrical dopant can be an n-type dopant or a p-type dopant.

The exemplary semiconductor structure can include a gate spacer 42 laterally surrounding a lower portion of the gate structure (52, 55) and contacting inner sidewalls of the doped silicate glass spacers (60 or 80). A horizontal interface between the gate dielectric 52 and the semiconductor fin {(1A, 1B) or (2A, 2B)} can be vertically recessed with respect a horizontal interface between the gate spacer 42 and a top surface of the source/drain regions (1A or 2A).

The exemplary semiconductor structure can further include a planarization dielectric layer 40 having a top surface that is coplanar with a top surface of the gate structure (52, 55). The planarization dielectric layer 40 can contact sidewalls and a top surface of the semiconductor fin {(1A, 1B) or (2A, 2B)} and a top surface of the substrate (10, 20). The planarization dielectric layer 40 can contact outer sidewalls of the doped silicate glass spacers (60 and/or 80).

In one embodiment, each of the doped silicate glass spacers (60, 80) can contact sidewalls and a top surface of the semiconductor fin {(1A, 1B) or (2A, 2B)}. In one embodiment, each of the doped silicate glass spacers (60, 80) can contact a top surface of the substrate (10, 20).

Within each gate cavity that is filled with a gate structure (52, 55), a gate spacer 42, and doped silicate glass spacers (60 and/or 80), the doped silicate glass spacers (60 or 80) can include a pair doped silicate glass spacers (60 or 80) that are not contiguous with each other and laterally spaced from each other by the gate structure (52, 55).

Figure 16B:
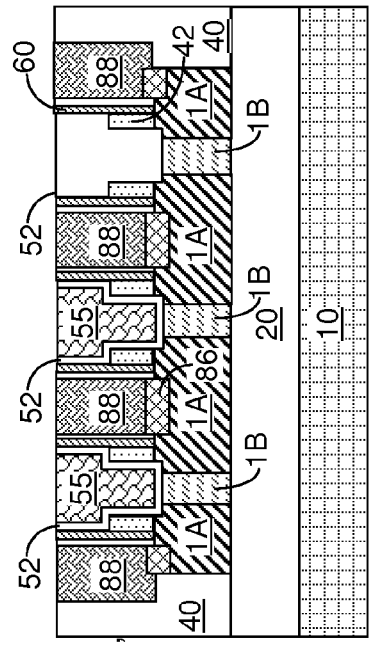
FIG. 16B is a vertical cross-sectional view of the exemplary semiconductor structure along the vertical plane B-B' of FIG. 16A.
Figure 16D:
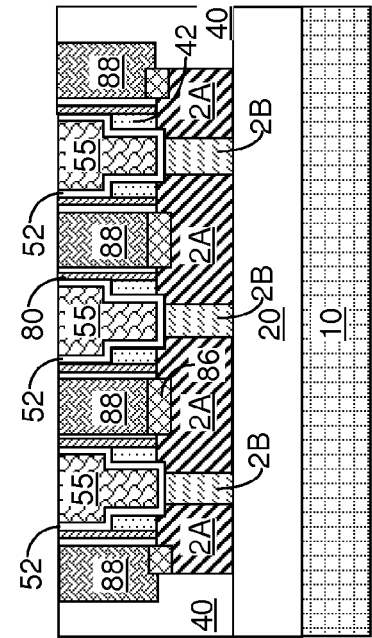
FIG. 16D is a vertical cross-sectional view of the exemplary semiconductor structure along the vertical plane D-D' of FIG. 16A.
Figure 16A:
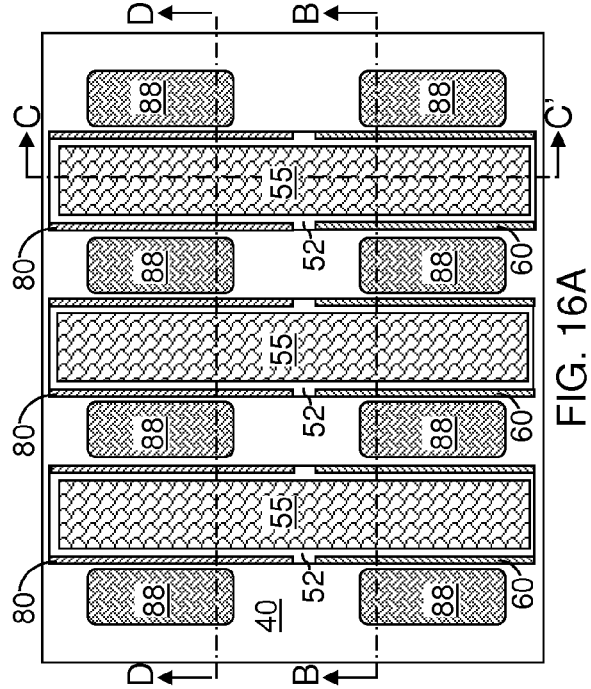
FIG. 16A is a top-down view of the exemplary semiconductor structure after formation of contact via structures according to an embodiment of the present disclosure.
Figure 16C:
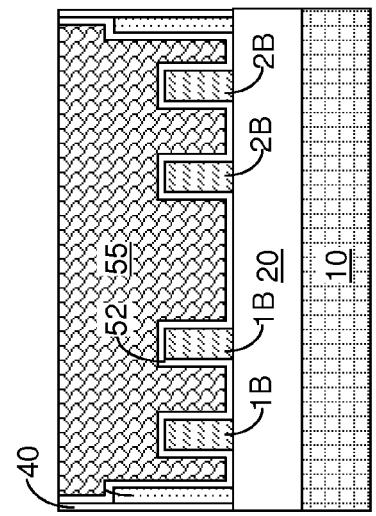
FIG. 16C is a vertical cross-sectional view of the exemplary semiconductor structure along the vertical plane C-C' of FIG. 16A.

Referring to FIGS. 16A-16D, various contact via structures 88 can be formed on the source/drain regions (1A, 2A) through the planarization dielectric layer 40. The various contact via structures 88 can be formed, for example, by formation of various contact via cavities over the source/drain regions (1A, 2A) and through the planarization dielectric layer 40, and by filling the various contact via cavities with a conductive material. The various contact via cavities 88 provide electrically conductive paths to the source/drain regions (1A, 2A). Interlayer dielectric material layers and metal interconnect structures can be formed above the planarization dielectric layer and the contact via structures 88 to provide electrically conductive paths as known in the art.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising:
a semiconductor fin located on a substrate;
a gate structure straddling said semiconductor fin and including a gate dielectric and a gate electrode;
doped silicate glass spacers straddling said semiconductor fin and laterally contacting vertical sidewalls of said gate dielectric;
source/drain regions located in said semiconductor fin and containing a same electrical dopant as said doped silicate glass spacers; and
a gate spacer laterally surrounding a lower portion of said gate structure and contacting inner sidewalls of said doped silicate glass spacers, wherein a horizontal interface between said gate dielectric and said semiconductor fin is vertically recessed with respect a horizontal interface between said gate spacer and a top surface of said source/drain regions.

2. The semiconductor structure of claim 1, further comprising a planarization dielectric layer having a top surface that is coplanar with a top surface of said gate structure.

3. The semiconductor structure of claim 2, wherein said planarization dielectric layer contacts sidewalls and a top surface of said semiconductor fin and a top surface of said substrate.

4. The semiconductor structure of claim 2, wherein said planarization dielectric layer contacts outer sidewalls of said doped silicate glass spacers.

5. The semiconductor structure of claim 1, wherein each of said doped silicate glass spacers contacts sidewalls and a top surface of said semiconductor fin.

6. The semiconductor structure of claim 5, wherein each of said doped silicate glass spacers contacts a top surface of said substrate.

7. The semiconductor structure of claim 1, wherein said doped silicate glass spacers comprise a pair doped silicate glass spacers that are not contiguous with each other and laterally spaced from each other by said gate structure.

8. The semiconductor structure of claim 1, wherein said same electrical dopant is an n-type dopant or a p-type dopant.

9. A method of forming a semiconductor structure comprising:
forming a planarization dielectric layer overlying a semiconductor fin on a substrate;
forming a gate cavity straddling said semiconductor fin;
forming doped silicate glass spacers in said gate cavity;
forming a gate spacer on inner sidewalls of said doped silicate glass spacers, wherein said gate structure is formed directly on said gate spacer and said doped silicate glass spacers;
forming a gate structure including a stack of a gate dielectric and a gate electrode within a remaining volume of said gate cavity; and
forming source/drain regions in said semiconductor fin by outdiffusing dopants from said doped silicate glass spacer by an anneal.

10. The method of claim 9, wherein said doped silicate glass spacers are formed by:
depositing a doped silicate glass spacer layer; and
anisotropically etching said doped silicate glass layer.

11. The method of claim 10, wherein said doped silicate glass layer is anisotropically etched employing a gas cluster ion beam including an etchant gas and impinging of said doped silicate glass layer along a direction perpendicular to a lengthwise direction of said semiconductor fin.

12. The method of claim 9, further comprising forming a gate spacer on inner sidewalls of said doped silicate glass spacers.

13. The method of claim 12, wherein said gate spacer is a contiguous structure including an opening therethrough.

14. The method of claim 12, wherein said doped silicate glass spacers are formed as a pair of disjoined structures that do not contact each other.

15. The method of claim 9, further comprising thinning a physically exposed portion of said semiconductor fin underneath said gate cavity prior to forming said gate structure.

16. The method of claim 9, wherein said gate cavity straddles another semiconductor fin, and said method further comprises:
forming, on said another semiconductor fin and within said gate cavity, additional doped silicate glass spacers including dopants of an opposite conductivity type than said dopants in said doped silicate glass spacers; and
forming additional source/drain regions in said another semiconductor fin by outdiffusing dopants of said opposite conductivity type from said another doped silicate glass spacer by said anneal.

17. A semiconductor structure comprising:
a semiconductor fin located on a substrate;
a gate structure straddling said semiconductor fin and including a gate dielectric and a gate electrode;
doped silicate glass spacers straddling said semiconductor fin and laterally contacting vertical sidewalls of said gate dielectric;

source/drain regions located in said semiconductor fin and containing a same electrical dopant as said doped silicate glass spacers; and a planarization dielectric layer having a top surface that is coplanar with a top surface of said gate structure, wherein said planarization dielectric layer contacts sidewalls and a top surface of said semiconductor fin and a top surface of said substrate.

18. The semiconductor structure of claim 17, further comprising a gate spacer laterally surrounding a lower portion of said gate structure and contacting inner sidewalls of said doped silicate glass spacers.

* * * * *